(12) United States Patent
Sharon et al.

(10) Patent No.: US 8,301,979 B2
(45) Date of Patent: Oct. 30, 2012

(54) LOW DENSITY PARITY CODE (LDPC) DECODING FOR MEMORY WITH MULTIPLE LOG LIKELIHOOD RATIO (LLR) DECODERS

(75) Inventors: Eran Sharon, Rishon Lezion (IL); Idan Alrod, Herzliya (IL); Ariel Navon, Hod Hashron (IL); Opher Lieber, Kfar Saba (IL)

(73) Assignee: SanDisk IL Ltd., Kfar Saba (IL)

( * ) Notice: Subject to any disclaimer, the term of this patent is extended or adjusted under 35 U.S.C. 154(b) by 486 days.

(21) Appl. No.: 12/574,982

(22) Filed: Oct. 7, 2009

(65) Prior Publication Data

US 2010/0088575 A1    Apr. 8, 2010

Related U.S. Application Data

(60) Provisional application No. 61/103,307, filed on Oct. 7, 2008.

(51) Int. Cl.
  *G11C 29/00* (2006.01)
(52) U.S. Cl. ......... 714/763; 714/728; 708/233; 708/250
(58) Field of Classification Search .................. 708/233, 708/250; 714/728
  See application file for complete search history.

(56) References Cited

U.S. PATENT DOCUMENTS

| | | | | |
|---|---|---|---|---|
| 5,623,638 | A * | 4/1997 | Andrade | 711/167 |
| 6,552,986 | B1 * | 4/2003 | Fukuda et al. | 369/53.37 |
| 7,266,750 | B1 | 9/2007 | Patapoutian | |
| 2003/0023917 | A1 * | 1/2003 | Richardson et al. | 714/749 |
| 2004/0148561 | A1 * | 7/2004 | Shen et al. | 714/803 |
| 2005/0257124 | A1 * | 11/2005 | Richardson et al. | 714/796 |
| 2006/0015791 | A1 * | 1/2006 | Kikuchi et al. | 714/758 |
| 2007/0058524 | A1 * | 3/2007 | Modlin et al. | 370/208 |
| 2007/0071140 | A1 | 3/2007 | Sontowski | |
| 2007/0076639 | A1 * | 4/2007 | Chou | 370/310 |
| 2007/0124657 | A1 | 5/2007 | Orio | |
| 2007/0210941 | A1 * | 9/2007 | Park et al. | 341/50 |
| 2007/0226586 | A1 * | 9/2007 | Park et al. | 714/758 |
| 2007/0245214 | A1 | 10/2007 | Ramamoorthy | |
| 2007/0283214 | A1 | 12/2007 | Lasser | |
| 2007/0283227 | A1 * | 12/2007 | Sharon et al. | 714/776 |
| 2008/0082897 | A1 * | 4/2008 | Brandman et al. | 714/763 |
| 2008/0086675 | A1 * | 4/2008 | Wu | 714/755 |
| 2008/0092026 | A1 | 4/2008 | Brandman | |

(Continued)

OTHER PUBLICATIONS

Land (Using the Mean Reliability as a design and stopping criterion for turbo codes), Sep. 2001, Faculty of engineering University of Keil, ITW2001, pp. 1-3.*

(Continued)

*Primary Examiner* — Scott Baderman
*Assistant Examiner* — Jeison C Arcos
(74) *Attorney, Agent, or Firm* — Vierra Magen Marcus & DeNiro LLP

(57) ABSTRACT

Data stored in memory is decoded using iterative probabilistic decoding and multiple decoders. A first decoder attempts to decode a representation of a codeword. If the attempt is unsuccessful, a second decoder attempts to decode the representation of a codeword. The second decoder may have a lower resolution than the first decoder. Probability values such as logarithmic likelihood ratio (LLR) values may be clipped in the second decoder. This approach can overcome trapping sets while exhibiting low complexity and high performance. Further, it can be implemented on existing decoders such as those used in current memory devices.

27 Claims, 7 Drawing Sheets

U.S. PATENT DOCUMENTS

| | | | |
|---|---|---|---|
| 2008/0148128 A1 | 6/2008 | Sharon | |
| 2008/0215950 A1 | 9/2008 | Shen | |
| 2008/0244338 A1 | 10/2008 | Mokhlesi | |
| 2008/0250300 A1 | 10/2008 | Mokhlesi | |
| 2008/0276156 A1* | 11/2008 | Gunnam et al. | 714/801 |
| 2008/0301521 A1* | 12/2008 | Gunnam et al. | 714/757 |
| 2009/0106626 A1 | 4/2009 | Hou | |
| 2009/0327836 A1* | 12/2009 | Shimizu | 714/758 |
| 2012/0030539 A1* | 2/2012 | Graef et al. | 714/758 |

OTHER PUBLICATIONS

T. Richardson, Error Floors of LDPC Codes, Proc. 41st Allerton Conf. on Communications, Control, and Computing, Monticello, IL, USA, Oct. 1-3, 2003.

C. Di, D. Proietti, E. Telatar, T. Richardson, and R. Urbanke, "Finite-length analysis of low-density parity-check codes on the binary erasure channel," IEEE Trans. Inform. Theory, vol. 48, No. 6, pp. 1570-1579, Jun. 2002.

B.J. Frey, R. Koeter and A. Vardy, "Signal-space characterization of iterative decoding," IEEE Trans. Inform. Theory, vol. 47, No. 2, pp. 766-780, Feb. 2001.

D.J.C. MacKay and M.S. Postol, "Weakness of Margulis and Ramanujan-Margulis low-density parity check codes," Electronic Notes in Theoretical Computer Science, vol. 74, 2003.

* cited by examiner

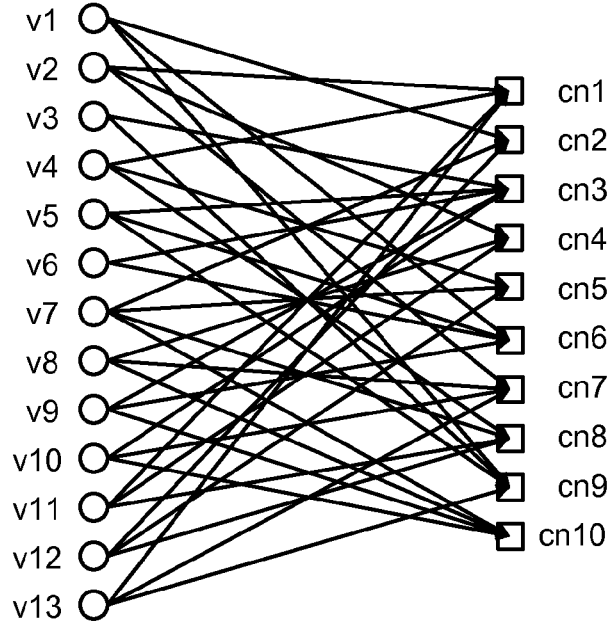

Fig. 9

| Bit position: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Programmed State (X): | | | | | | | | | | | | | | | | |
| Top | 1 | 0 | 0 | 1 | 1 | 0 | 0 | 1 | 1 | 0 | 0 | 1 | 1 | 0 | 0 | 1 |
| Higher | 1 | 1 | 0 | 0 | 0 | 0 | 1 | 1 | 1 | 1 | 0 | 0 | 0 | 0 | 1 | 1 |
| Upper | 1 | 1 | 1 | 1 | 0 | 0 | 0 | 0 | 0 | 0 | 0 | 0 | 1 | 1 | 1 | 1 |
| Lower | 1 | 1 | 1 | 1 | 1 | 1 | 1 | 1 | 0 | 0 | 0 | 0 | 0 | 0 | 0 | 0 |

Bit values

Fig. 10

LLR table, 1000

| Bit position: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Read result (Y) | | | | | | | | | | | | | | | | |
| Top | -M1 | M1 | M1 | -M1 | -M1 | M1 | M1 | -M1 | -M1 | M1 | M1 | -M1 | -M1 | M1 | M1 | -M1 |
| Higher | -M2 | -M1 | M1 | M2 | M2 | M1 | -M1 | -M2 | -M2 | -M1 | M1 | M2 | M2 | M1 | -M1 | -M2 |
| Upper | -M3 | -M3 | -M2 | -M1 | M1 | M2 | M3 | M3 | M3 | M3 | M2 | M1 | -M1 | -M2 | -M3 | -M3 |
| Lower | -M3 | -M3 | -M3 | -M3 | -M3 | -M3 | -M2 | -M1 | M1 | M2 | M3 | M3 | M3 | M3 | M3 | M3 |

LLRs

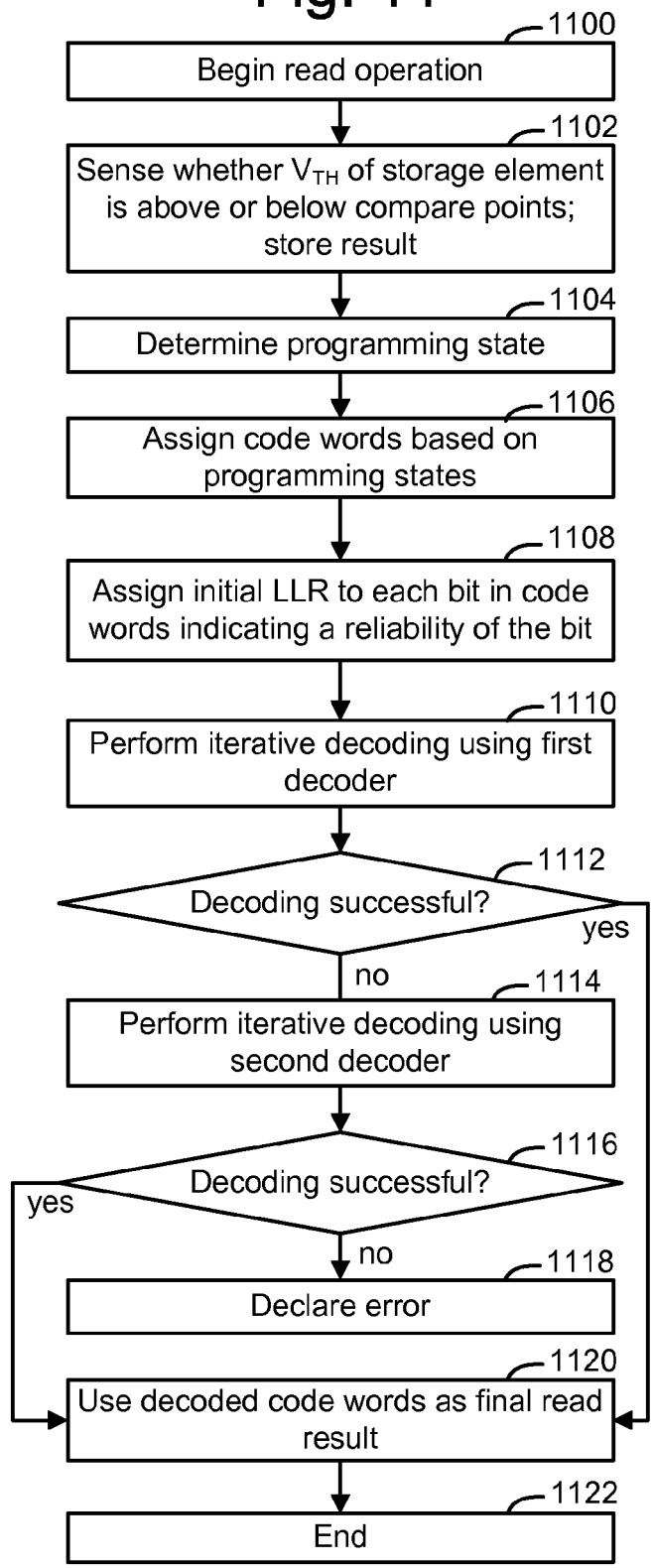

LOW DENSITY PARITY CODE (LDPC) DECODING FOR MEMORY WITH MULTIPLE LOG LIKELIHOOD RATIO (LLR) DECODERS

CROSS-REFERENCE TO RELATED APPLICATIONS

This application claims the benefit of U.S. provisional patent application No. 61/103,307, filed Oct. 7, 2008, and incorporated herein by reference.

BACKGROUND

The present technology relates to a decoding technique suitable for cases in which the decoding time can vary, hence suitable for storage applications.

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Once the storage elements in the memory device have been programmed, it is important that their programming states can be read back with a high degree of reliability. However, the sensed programming states can sometimes vary from the written programming states due to various factors. Error correction decoding can be useful in this regard. Moreover, probabilistic iterative decoding techniques can provide additional benefits. However, improved decoding techniques are needed to overcome problems such as failure of the decoding process to converge.

The present technology addresses the above and other issues by providing an iterative probabilistic decoding technique for reading a memory device, and to a corresponding memory device.

BRIEF DESCRIPTION OF THE DRAWINGS

FIG. 6 depicts a sparse parity check matrix.

FIG. 7 depicts a sparse bipartite graph which corresponds to the sparse parity check matrix of FIG. 6.

FIG. 9 depicts a table which provides multi-bit code words for different programmed states of a non-volatile storage element.

FIG. 10 depicts a table which provides initial values of log likelihood ratios (LLRs) for each bit of a code word based on a read result.

FIG. 11 is a flowchart of a process for performing a read operation on a storage element using first and second decoders.

DETAILED DESCRIPTION

The present technology provides an iterative probabilistic decoding technique for reading a memory device, and to a corresponding memory device.

Figure 1:
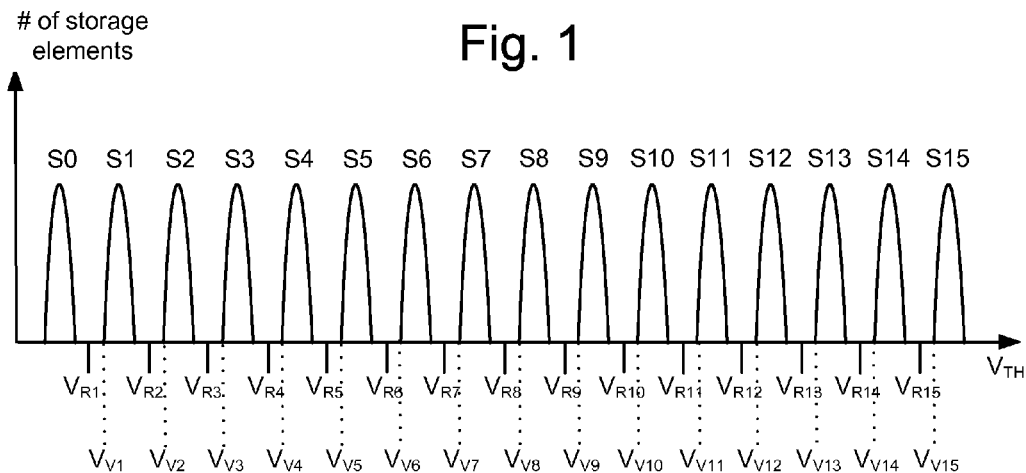
FIG. 1 depicts a threshold voltage distribution of a set of non-volatile storage elements, with corresponding verify and read voltages.

FIG. 1 depicts a threshold voltage distribution of a set of non-volatile storage elements, with corresponding verify and read voltages. The threshold voltage of a storage element is the lowest voltage that, when applied to the control gate of the storage element, changes the channel state from a non-conducting state to a conducting state. This voltage is affected by the amount of negative charge trapped in the floating gate: the more charge, the higher the threshold voltage of the cell.

The most common kind of Multi Level Cell (MLC)-type devices uses four charge amounts in the floating gate, including zero charge, so the state can be represented by four voltage levels, thus MLC storage element stores two bits of data. Generally, N bits per storage element can be represented using $2^N$ voltage levels. Newer devices are expected to use eight, sixteen or even more voltage levels. Using a high number of bits per storage element allows the production of flash devices with high data density and thus reduces the overall cost per flash device. An MLC device that stores N bits per cell, that are represented by $2^N$ states, uses $2^N-1$ reference voltage levels for read operations. For example, with four bits per cell (N=4), there are sixteen states and fifteen reference voltage levels.

In FIG. 1, the graph includes an x-axis which represents a threshold voltage and a y-axis which represents a number of storage elements. The example MLC device includes sixteen states, state 0 (S0) through state 15 (S15), associated verify voltages $V_{V1}$ through $V_{V15}$ and associated read voltages $V_{R1}$ through $V_{R15}$.

Figure 2:
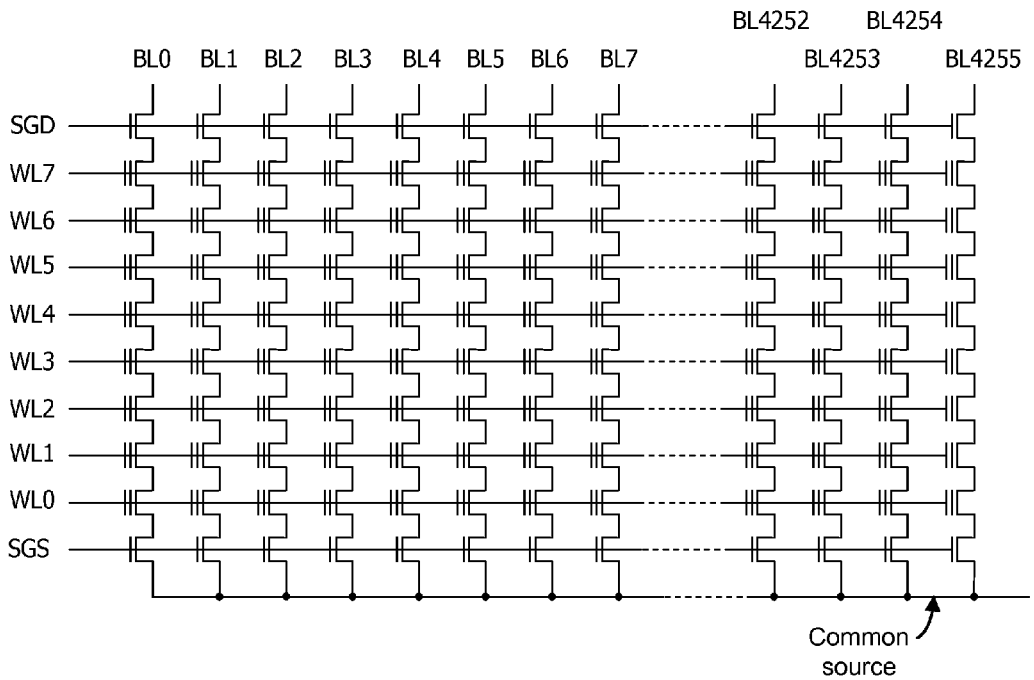
FIG. 2 depicts a block of storage elements.

FIG. 2 depicts a block of storage elements. In one example implementation, a NAND flash EEPROM can be partitioned into 1,024 blocks. The data stored in each block can be simultaneously erased. In one embodiment, the block is the minimum unit of storage elements that are simultaneously erased. In each block, in this example, there are 266 columns corresponding to bit lines BL0, BL1, BL4255. Typically, each column holds 16 bit lines. In one embodiment referred to as an all bit line (ABL) architecture, all the bit lines of a block can be simultaneously selected during read and program operations, and storage elements along a common word line and connected to any bit line can be programmed at the same time.

In the example provided, eight storage elements are connected in series to form a NAND string, and there are eight data word lines WL0 through WL7. A NAND string can also include dummy storage elements and associated word lines. In other embodiments, the NAND strings can have more or less than eight data storage elements. Data memory cells can store user or system data. Dummy memory cells are typically not used to store user or system data.

One terminal of each NAND string is connected to a corresponding bit line via a drain select gate (connected to select gate drain line SGD), and another terminal is connected to a common source via a source select gate (connected to select gate source line SGS). Thus, the common source is coupled to each NAND string.

In one embodiment, referred to as an odd-even architecture, the bit lines are divided into even bit lines and odd bit lines. In this case, storage elements along a common word line and connected to the odd bit lines are programmed at one time, while storage elements along a common word line and connected to even bit lines are programmed at another time. In each block, the columns are divided into even bit lines and odd bit lines.

During one configuration of read and programming operations, 4,256 storage elements are simultaneously selected. The storage elements selected have the same word line and are thus part of a common physical page. Therefore, 532 bytes of data, which also form a logical page, can be read or programmed simultaneously, and one block of the memory can store at least eight logical pages. In this example, a physical page and a logical page are the same but, in general, this is not required. For example, a physical page can include multiple logical pages. A logical page is typically the smallest set of storage elements that are written (programmed) simultaneously. For multi-state storage elements, when each storage element stores two bits of data, where each of these two bits are stored in a different page, one block stores sixteen logical pages. Other sized blocks and pages can also be used.

For either the ABL or the odd-even architecture, storage elements can be erased by raising the p-well to an erase voltage (e.g., 20 V) and grounding the word lines of a selected block. The source and drain of the bit lines are floating. Erasing can be performed on one block at a time, or in some flash memory devices—a few blocks at a time. Electrons are transferred from the floating gates of the storage elements to the p-well region so that the threshold voltage ($V_{TH}$) of the storage elements becomes negative.

In the read and verify operations, the select gates (SGD and SGS) are connected to a voltage in a range of 2.5 to 4.5 V and the unselected word lines are raised to a read pass voltage, (typically a voltage in the range of 4.5 to 6 V) to make the transistors operate as pass gates. The selected word line is connected to a voltage, a level of which is specified for each read and verify operation, to determine whether a $V_{TH}$ of the concerned storage element is above or below such level. The source and p-well are at 0 V. The selected bit lines are precharged to a level of, for example, 0.7 V. If the $V_{TH}$ is higher than the read or verify level on the word line, the potential level of the bit line associated with the storage element of interest maintains the high level because of the non-conductive storage element. On the other hand, if the $V_{TH}$ is lower than the read or verify level, the potential level of the concerned bit line decreases to a low level, for example, less than 0.5 V, because the conductive storage element discharges the bit line. The state of the storage element can thereby be detected by a voltage comparator sense amplifier that is connected to the bit line, in one possible implementation. As with programming, read operations can be performed on a per-page basis.

Many details of erase, read and verify operations described above are performed according to techniques known in the art. Thus, many of the details explained can be varied by one skilled in the art. Other erase, read and verify techniques known in the art can also be used.

Figure 3:
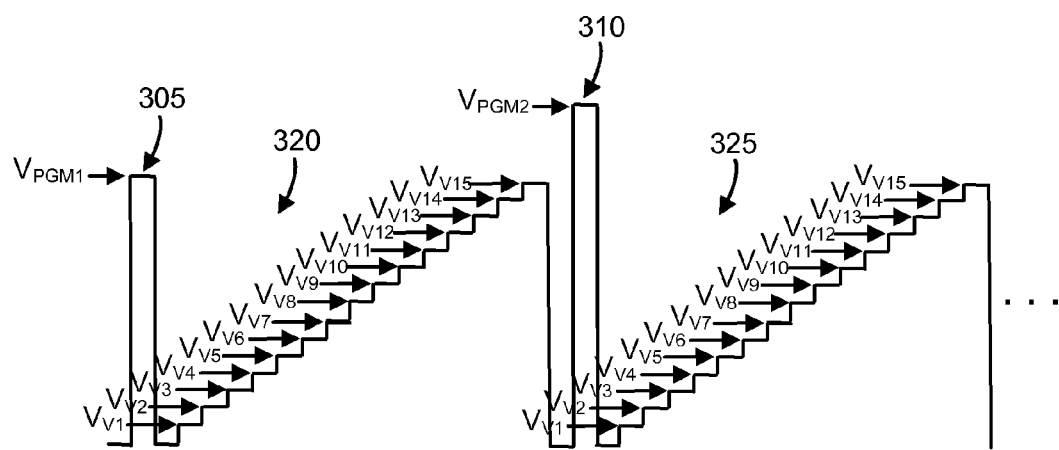
FIG. 3 depicts a pulse train of programming voltages and verify voltages.

FIG. 3 depicts a pulse train of programming voltages and verify voltages which are applied to the control gates of storage elements during a program-verify, such as on a common selected word line. The programming voltages can increase in amplitude in a step wise manner, e.g., starting at a program pulse 305 having an amplitude of $V_{PGM1}$, followed by a program pulse 310 having an amplitude of $V_{PGM2}$, and so forth. After each program pulse, a series of verify voltages $V_{V1}$ through $V_{V15}$ is applied, as depicted by waveforms 320 and 325. The conductive/non-conductive condition of the storage elements can be determined for each verify level, to ascertain whether the storage elements have reached an intended data state.

Figure 4:
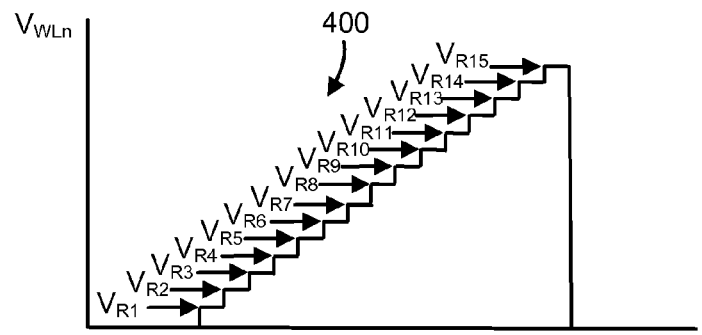
FIG. 4 depicts a pulse train of read voltages.

FIG. 4 depicts a pulse train of read voltages, also referred to control gate read voltages, which are applied to the control gates of storage elements during a read operation, such as via a common selected word line. During a read operation, a series of read voltages $V_{R1}$ through $V_{R15}$ is applied, as depicted by waveform 400. The conductive/non-conductive condition of the storage elements can be determined for each read level, to ascertain the data states of the storage elements. In the examples of FIGS. 3 and 4, there are sixteen data states.

Figure 5:
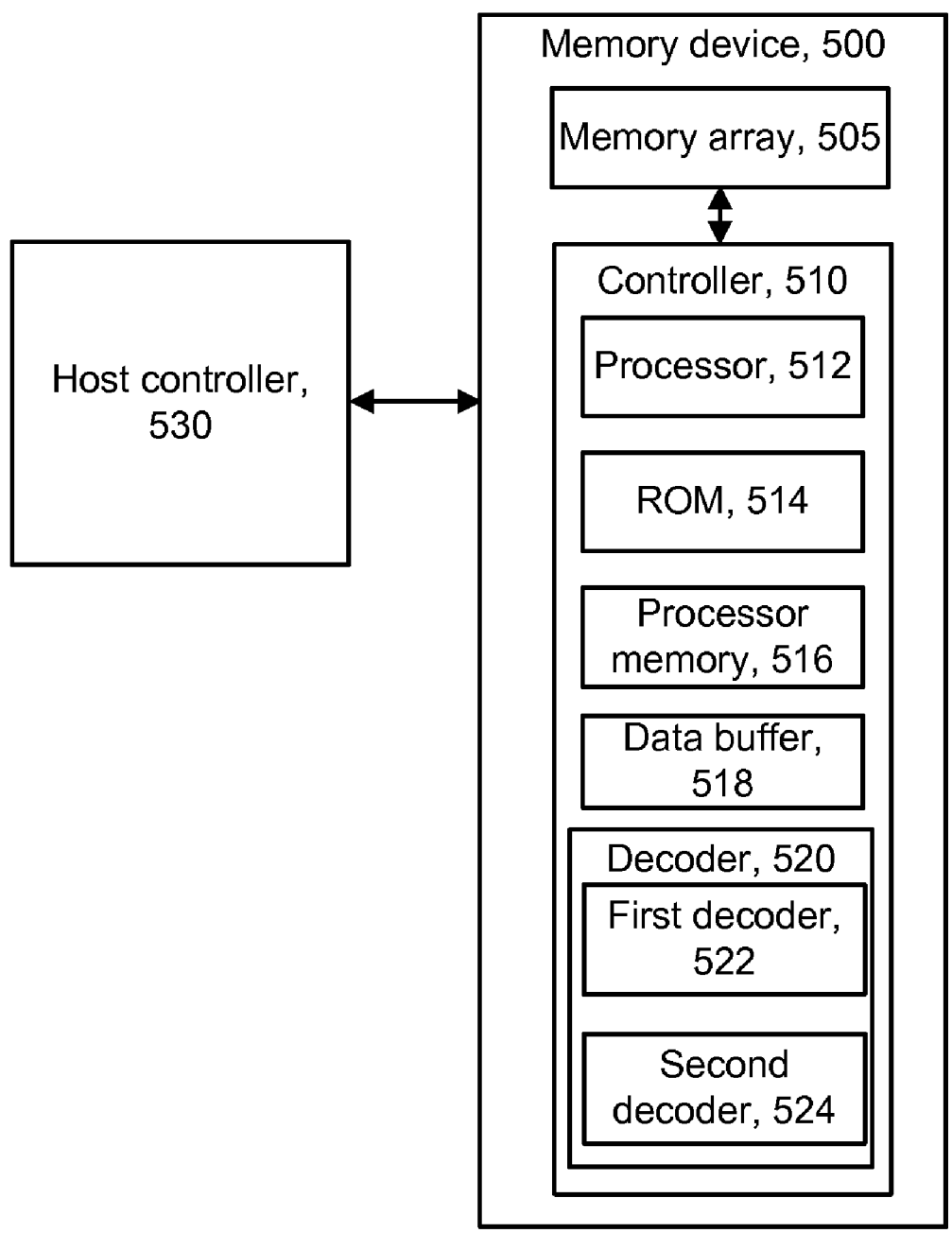
FIG. 5 depicts an overview of a host controller and a memory device in a storage system.

FIG. 5 depicts an overview of a host controller and a memory device in a storage system. The memory device alone may also be considered to be a storage system. The memory device 500 includes a flash non-volatile memory array 505 of storage elements. Also provided is a controller 510 for performing operations such as programming/verifying and reading. The controller 510 includes a processor 512 for executing code which is stored in a non-volatile memory such as a ROM 514, and a processor memory 516 to which the code is loaded. The processor memory 516 may be, e.g., a dynamic memory RAM, which can be used for both code and variables. A data buffer 518 is provided for temporarily storing and processing data being written to or read from the memory array. The ROM memory 514 can be considered to be a processor-readable storage medium having processor-readable code embodied thereon, where the processor-readable code, when executed, performs computer-implemented decoding techniques as described herein.

The memory device may be formed on a removable memory card or USB flash drive, for instance, which is inserted into a host device such as a laptop computer, digital camera, personal digital assistant (PDA), digital audio player or mobile phone. A host device may have its own host controller 530 with analogous component as the controller 510 for interacting with the memory device, such as to read or write user data. For example, when reading data, the host controller can send commands to the memory device indicating an address of user data to be retrieved. The memory device controller 510 converts such commands into command signals that can be interpreted and executed by control circuitry in the memory device.

The controller 510 also includes a decoder 520, which can include a first decoder 522 and a second decoder 524, for decoding data which is read from the memory array 505, as discussed in further detail below. In one approach, the first and second decoders are the same decoder, but activated with different parameters. These parameters are used in a different manner by the controller to translate data in the temporary data buffer 518 into LLR values.

The memory device 500 responds to a read command by reading the data from the memory array 505, processing the read data, and making it available to the host controller 530. In one possible approach, the memory device stores the read data in the data buffer 518, processes the read data using the decoder 520, and informs the host controller 530 of when the data can be read. The host controller responds by reading the data from the buffer and sends another command to the memory device to read data from another address. For example the data may be read page by page.

A typical memory system includes an integrated circuit chip that includes the controller 510, and one or more integrated circuit chips that each contains a memory array and associated control, input/output and state machine circuits. The memory device may be embedded as part of the host system, or may be included in a memory card that is removably insertable into a mating socket of a host system. Such a card may include the entire memory device, or the controller and memory array, with associated peripheral circuits, may be provided in separate cards.

Probabilistic Iterative Decoding

Iterative coding schemes have become very popular in recent years, due to their ability to achieve near-Shannon limit performance at low decoding complexity. In these schemes, the code is constructed as a concatenation of several simple constituent codes and decoded using an iterative decoding algorithm by exchanging information between the constituent decoders of the simple codes. Usually, at least one constitute code can be defined using a bipartite graph describing the interconnections between check nodes and variable nodes of that particular code; however, the same structure can also describe interconnections between the constitute codes as recently demonstrated in U.S. patent app. publication no. 2008/0294960, published Nov. 27, 2008, titled "MemoryEfficient LPDC Decoding," incorporated herein by reference. In this case, decoding can be viewed as an iterative message passing over the sub-graphs, in addition to message passing within the edges of each sub-graph. A popular class of iterative codes is Low-Density Parity-Check (LDPC) codes. A constitute code is a code which is part of an overall code which has multiple constitute codes.

LDPC codes are typically applied to multiple code words which are encoded across a number of storage elements. The codewords can represent information bits and parity bits, where the parity bits are provided according to an error correction coding process.

Generally, an LDPC code is a linear block code which is characterized by a sparse parity check matrix, e.g., as depicted by the matrix H (FIG. 6). The matrix includes M rows and K+M columns, which are in correspondence with K information bits and M parity bits in each codeword of length N=K+M. Further, the parity bits are defined such that M parity check equations are satisfied, where each row of the matrix represents a parity check equation.

FIG. 7 depicts a sparse bipartite graph which corresponds to the sparse parity check matrix of FIG. 6. Specifically, the code can be defined by a sparse bipartite graph G=(V,C,E) with a set v of N bit nodes (N=13 in this example), a set C of M check nodes (M=10 in this example) and a set E (E=38 in this example) of edges connecting bit nodes to check nodes. The bit nodes correspond to the codeword bits and the check nodes correspond to parity-check constraints on the bits. A bit node is connected by edges to the check nodes it participates in.

During decoding, the decoder attempts to satisfy the parity checks. In this example, there are ten parity checks, as indicated by the check nodes cn1 through cn10. The first parity check at cn1 determines if v2⊕v4⊕v11⊕v13=0, where "⊕" denotes the exclusive-or (XOR) logical operation. This check is satisfied if there is an even number of "1" in bits corresponding to variable nodes v2, v4, vii and v13. This check is denoted by the fact that arrows from variable nodes v2, v4, v11 and v13 are connected to check node cn1 in the bi-partite graph. The second parity check at cn2 determines if v1⊕v7⊕v12=0, the third parity check at cn3 determines if v3⊕v5⊕v6⊕v9⊕v10=0, the fourth parity check at cn4 determines if v2⊕v8⊕v11=0, the fifth parity check at cn5 determines if v4⊕v7⊕v12=0, the sixth parity check at cn6 determines if v1⊕+v5⊕v6⊕v9=0, the seventh parity check at cn7 determines if v2⊕v8⊕v10⊕v13=0, the eighth parity check at cn8 determines if v4⊕v7⊕v11⊕v12=0, the ninth parity check at cn9 determines if v1⊕v3⊕v5⊕v13=0 and the tenth parity check at cn10 determines if v7⊕v8⊕v9⊕v10=0.

As mentioned, LDPC codes can be decoded using an iterative probabilistic decoding process involving iterative message passing decoding algorithms. These algorithms operate by exchanging messages between bit and check nodes over the edges of the underlying bipartite graph representing the code.

The decoder is provided with initial estimates of the codeword bits (based on the communication channel output or based on the read content from the memory array). These initial estimates are refined and improved by imposing the parity-check constraints that the bits should satisfy as a valid codeword. This is done by exchanging information between the bit nodes representing the codeword bits and the check nodes representing parity-check constraints on the codeword bits, using the messages that are passed along the graph edges.

For example, the iterating can involve serially traversing the check nodes and updating the LLR values of the bits involved based on each parity check. In one approach, an attempt is made to satisfy the first parity check of cn1. Once that parity check is satisfied, an attempt is made to satisfy the cn2 parity check and so forth. The LLR values are adjusted, if necessary, in each iteration, in a manner known to those skilled in the art.

Specifically, in iterative decoding algorithms, it is common to utilize "soft" bit estimations, which convey both the bit estimation and the reliability of the estimation.

The bit estimations conveyed by the messages passed along the graph edges can be expressed in various forms. A common measure for expressing "soft" bit estimation is the Log-Likelihood Ratio (LLRs), defined as follows:

$$LLR = \log\frac{Pr(v = 0 \mid \text{current constraints and observations})}{Pr(v = 1 \mid \text{current constraints and observations})} \quad (1.1)$$

where the "current constraints and observations" are the various parity-check constraints taken into account in computing the message at hand and the observations corresponding to the bits participating in these parity checks. Without loss of generality, we assume that LLR messages are used throughout the rest of this document. The sign of the LLR typically provides the bit estimation (i.e. positive LLR corresponds to v=0 and negative LLR corresponds to v=1). The magnitude of the LLR provides the reliability of the estimation (i.e. |LLR|=0 means that the estimation is completely unreliable and |LLR|=∞ means that the estimation is completely reliable and the bit value is known).

Usually, the messages passed during the decoding along the graph edges between bit nodes and check nodes are extrinsic. An extrinsic message 'm' passed from a bit node 'v' on edge 'e' may take into account all the values received on edges connected to bit node 'v' other than edge 'e' (this is why it is called extrinsic—since it is based only on new information).

An example of a message passing decoding algorithm is the Belief-Propagation (BP) algorithm, which is the best algorithm among this family of algorithms. Let $$P_v = \log\frac{Pr(v = 0 \mid y)}{Pr(v = 1 \mid y)} \quad (1.2)$$

denote the initial decoder estimation for bit v, based only on the received or read symbol 'y'. Note that it is also possible that some of the bits are not transmitted through the communication channel or stored in the memory array, hence there is no 'y' observation for these bits. In this case, there are two possibilities: 1) shortened code, e.g., the bits are known a priori and $P_v=\pm\infty$ (depending on whether the bit is 0 or 1), and 2) punctured bits the bits are unknown a priori and $$P_v = \log\frac{Pr(v = 0)}{Pr(v = 1)} \quad (1.3)$$

where $Pr(v=0)$ and $Pr(v=1)$ are the a priori probabilities that the bit v is 0 or 1 respectively. In the contents of flash memory, punctured bits are simply not stored in the memory array. Assuming the information bits have equal a priori probabilities to be 0 or 1 and assuming the code is linear, then:

$$P_v = \log\frac{1/2}{1/2} = 0 \quad (1.4)$$

Let $$Q_v = \log\frac{Pr(v = 0 \mid \underline{y}, H \cdot \underline{v} = 0)}{Pr(v = 1 \mid \underline{y}, H \cdot \underline{v} = 0)} \quad (1.5)$$

denote the final decoder estimation for bit 'v', based on the entire received or read sequence 'y' and assuming that bit 'v' is part of a codeword (i.e. assuming H·v=0).

Let $Q_{vc}$ and $R_{cv}$ denote a message from bit node 'v' to check node 'c' and a message from check node 'c' to bit node 'v', respectively. The BP algorithm utilizes the following update rules for computing the messages. The bit node to check node computation rule is:

$$Q_{vc} = P_v + \sum_{c' \in N(v,G)\backslash c} R_{c'v} \quad (1.6)$$

Here N(v,G) denotes the set of neighbors of a node 'v' in the graph G and N(v,G)\c refers to the neighbors excluding node 'c'. The check node to bit node computation rule in the BP algorithm is:

$$R_{cv} = \varphi^{-1}\left(\sum_{v' \in N(c,G)\backslash v} \varphi(Q_{v'c})\right) \quad (1.7)$$

Here, $$\varphi(x) = \left\{\sin(x) - \log\tanh\left(\frac{|x|}{2}\right)\right\} \quad (1.8)$$

and operations in the $\phi$ domain are done over the group $\{0,1\}\times R^+$ (this basically means that the summation here is defined as summation over the magnitudes and XOR over the signs).

In a similar manner, N(c,G), denotes the set of bit node neighbors of a check node 'c' in the graph G and N(c,G)\v refers to the neighbors excluding node 'v'. The final decoder estimation for bit 'v' is:

$$Q_v = P_v + \sum_{c' \in N(v,G)} R_{c'v} \quad (1.9)$$

The minimum distance of the code is defined as minimal number of locations in which two code words are different over any two code words in the code. A codeword is any vector 'c' which satisfies the equation H×c=0, where 'H' is the parity check matrix of the code. Due to the structural limitations of LDPC codes, which can result in a small minimum distance between code words (especially in highly optimized irregular LDPC where the code length is not very long) and due to the sub optimality of iterative decoding, LDPC codes can suffer from high error floor. Performance curves, e.g., of error probability rate versus signal-to-noise ratio (SNR), of iterative coding schemes such as LDPC are known as waterfall curves, where the bottom of the waterfall is referred to as an error floor. The error floor is a region in which the slope of the curve is decreased relative to the slope at a lower SNR. A high error floor may pose a problem in certain applications, such as storage applications in which strict reliability requirements are common (for example, a practical storage system which holds data with a guaranteed reliability defined by no more than 1 bit error per $10^{14}$ stored bits). Hence, LDPC codes for such applications should exhibit a very low error floor. The error floor of an LDPC code under iterative decoding is governed by specific combinatorial configurations appearing in the underlying graph representing the code. For example, error floors in LDPC codes can be caused by low-weight codewords, which have few 1's.

The performance of an LDPC code can be measured by an error probability which is plotted on a log scale against a parameter that specifies one of a class of channels ranging from low-fidelity to high-fidelity. For example, error probability is often plotted against the SNR of the standard deviation of an Additive White Gaussian Noise (AWGN) channel, or against the probability of crossover on a Binary Symmetric Channel (BSC) or probability of erasure on a Binary Erasure Channel (BEC). For the Binary Erasure Channel (BEC), iterative decoding fails if the erasures encompass a subset of the bits forming a stopping set, as discussed in C. Di, D. Proietti, E. Telatar, T. Richardson, and R. Urbanke, "Finite-length analysis of low-density parity-check codes on the binary erasure channel," IEEE Trans. Inform. Theory, vol. 48, no. 6, pp. 1570-1579, June 2002, incorporated herein by reference (Reference [1]). A stopping set S is a subset of V, the set of variable nodes, such that all neighbors of S are connected to S at least twice (by at least two edges). In other words, the stopping set is a set of the code symbols such that every row has either zero or at least two nonzero elements in the set. For other channels, the graph configurations dominating the error floor are harder to define. They depend on the specific decoding algorithm and channel. Stopping sets are known by different names, according to different interpretations, including trapping sets as discussed in T. Richardson, "Error Floors of LDPC Codes," Proc. 41st Allerton Conf. on Communications, Control, and Computing, Monticello, Ill., USA, Oct. 1-3, 2003, incorporated herein by reference (Reference [2]), pseudo-codewords as discussed in B. J. Frey, R. Koeter and A. Vardy, "Signal-space characterization of iterative decoding," IEEE Trans. Inform. Theory, vol. 47, No. 2, pp. 766-780, February 2001, incorporated herein by reference (Reference [3]), and near-codewords as discussed in D. J. C. MacKay and M. S. Postol, "Weakness of Margulis and Ramanujan-Margulis low-density parity check codes," Electronic Notes in Theoretical Computer Science, vol. 74, 2003, incorporated herein by reference (Reference [4]).

Trapping sets were described in Reference [2] as: "These are sets with a relatively small number of variable nodes such that the induced sub-graph has only a small number of odd degree check nodes." Trapping sets are related to the topology of the LDPC graph and to the specific decoding algorithm used, and are hard to avoid and analyze. The influence of trapping sets on the onset of error-floors in LDPC codes can be attributed to the following phenomena, related both to the properties of the code graph and decoding algorithm, as well as to realization of certain special channel noise configurations. In the initial stage of BP decoding, due to the presence of special low-probability noise samples, variable nodes internal to one particular trapping set (termed the initial trapping set) experience a large increase in reliability estimates for incorrect bit values.

This information gets propagated to other variable nodes in the trapping set, some of which already have unreliable bit estimates themselves. After this initial biasing, external variables usually start to correct their initially incorrect estimates. By that time, the variable nodes in a trapping set have already significantly biased their decisions towards the wrong values. Since there are very few check nodes capable of detecting errors within trapping sets, this erroneous information persists in the graph until the end of the decoding process. Furthermore, the unreliable estimates in trapping sets sometimes get "amplified" and/or "exported" to the variable nodes external to the trapping set. The degree of influence of the trapping set on the external variables (and vice-versa) is an important factor that influences the behavior of trapping sets under iterative decoding, and it cannot be described in a simple manner.

Regarding pseudo-codewords as discussed in Reference [3], iterative decoding of codewords decodes to a "pseudo signal" that has the highest correlation with a channel output. The set of pseudo signals corresponds to pseudo-codewords, a vanishingly small number of which correspond to codewords. Regarding near-codewords as discussed in Reference [4], a (w, v) near-codeword of a code with a parity check matrix H is defined as a vector 'f' whose syndrome $z(x)=H \times f$ has a weight 'w' while 'w' is relatively small.

Various techniques can be used for addressing trapping sets, some of which are effective in terms of performance, but carry a large penalty of complexity, while other methods, which are less complex, are not optimized in terms of performance. Moreover, some approaches exhibit low complexity, and good performance, but require a specific design and therefore cannot be used in a generic decoder designed for memory devices. A desirable decoding technique should exhibit low complexity and high performance, and can be implemented on existing decoders such as those used in current memory devices.

One possible approach is based on using an existing decoder structure, with somewhat modified LLR initialization rules. First the decoder operates on the received representation of a codeword while computing the LLRs with a high resolution. This in turn provides a good decoder with a very low error rate, but in a few cases, the decoder may get trapped in a trapping set. Once trapped, the decoder detects the failure of the decoding typically by failing to converge within a predefined set of iterations, that is, within a predefined number of iterations. Or, a failure may be detected based on failure to converge within a predefined time period, or failure to satisfy a given number of parity checks. When such a failure is detected, the first decoding attempt is terminated and other measures can be applied for decoding the initial received representation of the codeword.

In particular, when a decoding failure (including a termination) is declared by the first decoder, a second decoder is applied to the received representation of the codeword, in order to decode it correctly. The technique can also be extended to a third or additional decoders, each of which uses a progressively lower resolution. The different decoders may be separate physically or may be provided by common circuitry which can be modified to use different decoding processes. The second decoder may represent a modified decoder relative to the first decoder. Another option is to perform the decoding by the different decoders in parallel, concurrently, and to use the result of the second decoder if the first decoder does not provide an acceptable result.

For example, the second decoder can be almost identical to the first decoder, with the difference being in the computation of the LLRs. For example, if the first decoder used a 16 bit resolution for LLR computations, the second decoder may use a lower resolution, e.g., only 8 or 4 bits for LLR computations. Alternatively, the second decoder may use the same resolution as the first decoder, but clip the values of the LLRs so they will not exceed a certain value. Generally, we may consider the first decoder to provide a fine decoding while the second decoder provides a coarse decoding. Note that, in this manner, the second decoding can be performed with minimal changes using the architecture designed for the first decoder.

Typically, the second decoder is inferior to the first decoder and has a larger error rate. However, the second decoder is applied only when the first decoder fails, such as when there are trapping set events, and in this case it has an advantage over the decoder applied as the first decoder. This can be explained by the fact that the absolute LLR values are decreased; thus; it is easier for information passing from external nodes to revert decisions made by the trapping set nodes. For the first decoder, if a node in a trapping set reaches a high absolute LLR value, it would make it very hard for external information to revert its decision.

See FIGS. 8-11 for further details.

U.S. patent app. publication no. 2007/0283227, published Dec. 6, 2007, titled "Error Correction Decoding By Trial And Error", and incorporated herein by reference, deals with the decoding of a codeword by applying a second decoder to the representation of a codeword in case of a failure of a first decoder. An example considered is when the second decoder is identical to the first decoder, with the exception that a different resolution is used for reading the representation of the codeword for the second decoding. This approach is different from the current approach in both its motivation and operation. The motivation for the reference application was to save power. Therefore the first decoder was operated in a low resolution, to conserve energy, while the second decoder used a finer resolution and increased power, and was activated only in case of a decoder failure. In contrast, one aspect of the current approach involves using a finer resolution first and then a lower, coarser resolution in the decoding. Another aspect of the current technology approach involves changing at least one parameter of the decoder. For example the rules by which the LLR values are computed is changed in the second decoder to include clipping in the computation of the initial LLR values, and from that point onward the first decoder and the second decoder continue in exactly the same manner.

In another embodiment of the present technology, the second decoder receives the LLRs of the first decoder once the first decoder has terminated with failure and clips the LLRs resulting from the operation of the first decoder, e.g., their sign bit remains; however, their resolution is reduced or reliability measures are reduced in order to allow extrinsic information to flow into the stopping set and thus allow the decoder which has almost converged (most bits outside the stopping set are correct; however, bits which belongs to a stopping set suffer from biasing) to converge to the correct code word.

Figure 8:
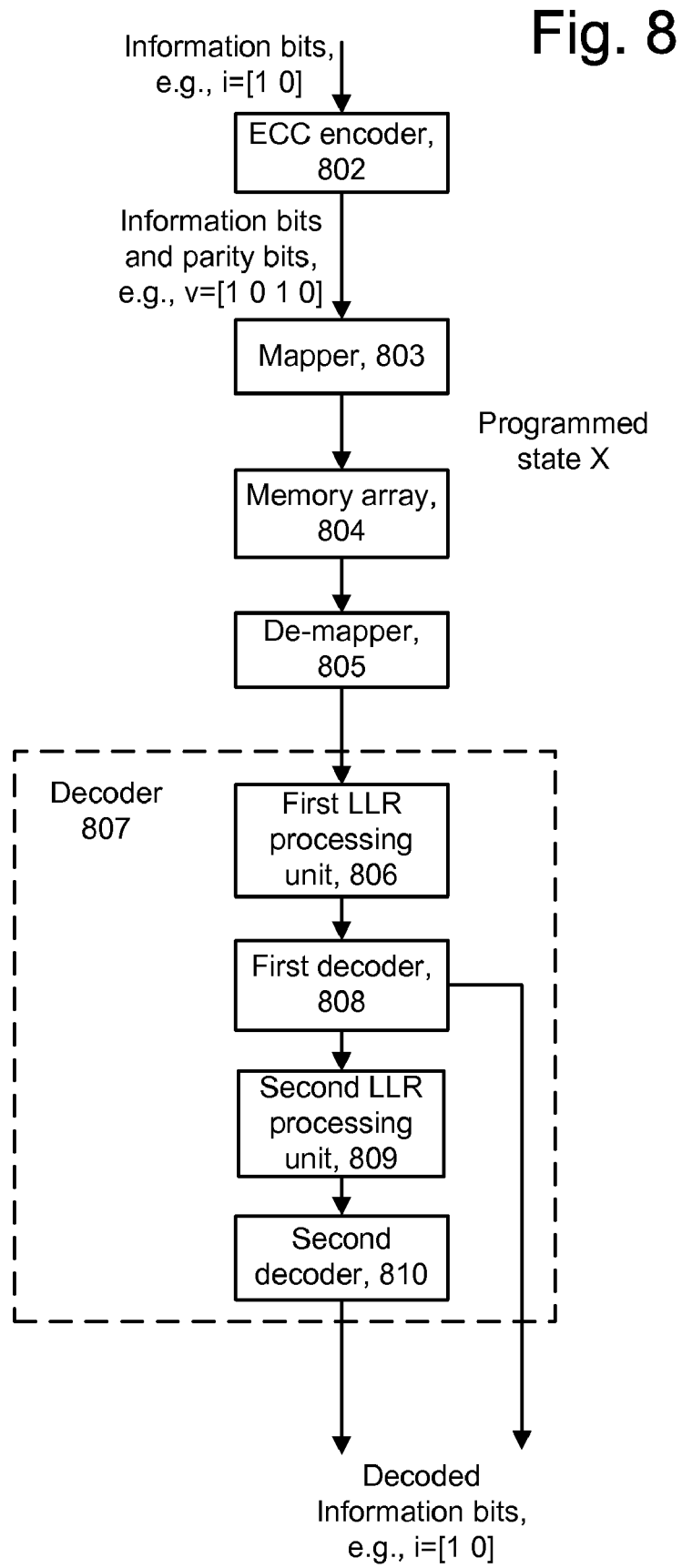
FIG. 8 depicts a system for encoding and decoding of data for non-volatile storage.

FIG. 8 depicts a system for encoding and decoding of data for non-volatile storage using iterative probabilistic decoding. The system includes an encoder 802, mapper 803, memory array 804, de-mapper 805, and a decoder 807, which has a first LLR processing unit 806, a first decoder 808, a second LLR processing unit 809 and a second decoder 810. The LLR processing units can be tables, for instance. The encoder 802 receives information bits, also referred to as user data, which is to be stored in the memory array 804. The information bits are represented by the vector i=[1 0]. The ECC encoder 802 implements an error correction coding process in which parity bits are added to the information bits to provide data represented by the vector or code word v=[1 0 1 0], indicating that two parity bits have been appended to the data bits. This is a simplified example which results in a high parity bit overhead cost. In practice, (LDPC) codes (also referred to as Gallager codes) may have a lower overhead. Such codes are typically applied to multiple code words which are encoded across a number of storage elements so that the parity bits are distributed among the storage elements. The data bits can be mapped to a logical page and stored in the memory array 804 by programming the non-volatile storage elements to particular programming states (X) which corresponds to v. Here, the code word v=[1 0 1 0] is written to a storage element by programming the storage element to state 6 (see FIG. 9 for the mapping)

The mapper 803 converts the bits into states. The de-mapper converts array voltages back to bits. The LLR processing unit, such as a table, translates voltages to LLR values. The first decoder 808 receives inputs from the first LLR processing unit 806, while the second decoder 810 receives inputs from the second LLR processing unit 809, which in turn receives inputs from the first decoder 808. The inputs from the first LLR processing unit 806 to the first decoder 808 can include LLRs as initial estimates of the code word bits. The inputs to the second LLR processing unit 809 can include LLR values which result from operation of the first decoder, along with the bits to be decoded, if the first decoder 808 fails to decode the bits. These resulting LLRs can be the final LLRs used by the first decoder. The second LLR processing unit 809 can process the received LLR values and provide them to the second decoder 810, e.g., as initial LLR values of the second decoder, in one possible approach. The processing can include clipping or other techniques for reducing the magnitude of the LLRs. As a simple example of clipping, the final LLRs from the first decoder may range in magnitude from 0-63. The magnitudes of the LLRs which are above a certain value, such as 11, can be clipped to 11, so that LLRs above 11 and up to 63 are set to 11, and LLRs from 0-11 are unchanged.

The second decoder then attempts to decode the bits. Either the first or second decoder provides the decoded information bits as an output, based on which decoder is successful.

For example, FIG. 9 depicts a table which identifies multi-bit code words for different programmed states of a non-volatile storage element. With sixteen states, a four bit code word can be used. Further, using a table 1000 for the first or second decoder, an LLR or other reliability metric is associated with each bit indicating the probability that the bit is not erroneous (a higher magnitude LLR indicates a higher probability that the bit is correct). FIG. 9 depicts bit values or code words in columns beneath the programmed states 0 through 15. The bit positions are depicted as top, higher, upper and lower. The lower bit is the most significant bit and the top bit is the least significant bit. Thus, the codeword for state 0 is 1111, the code word for state 1 is 1110, and so forth. Moreover, an LLR is associated with each bit as indicated in FIG. 10.

Referring again to FIG. 8, when it is desired to retrieve the stored data, the memory array 804 is read. However, the read state can sometimes be erroneous for various reasons. In one example approach, a read state Y is state 7 (instead of state 6), which is represented by the code word y=[1 0 1 1]. Using Y, the LLR table 1000 is accessed to obtain initial LLR values for use in the decoding process.

FIG. 10 depicts further details of the LLR table 1000. The LLRs magnitudes are denoted by example placeholder values M1, M2 and M3, where M1<M2<M3. In practice, the LLRs can extend in a range of possible real numbers. For the read codeword y=[1 0 1 1] the initial LLRs are −M1, M3, −M2 and M1. Thus, an LLR is provided for each of the four bit positions in the codeword 'y'. As mentioned previously, a positive LLR indicates a 0 bit, a negative LLR indicates a 1 bit, and a greater magnitude indicates a greater reliability or probability of correctness. For example, for the lower bits in states 0 through 5, the LLR=−M3, indicating these bits have a high probability of being a 1. This can be seen intuitively, since the probability that the read state Y is far away from the pro-grammed state, e.g., several states away, is small. Thus, the LLR for the lower bit for state 5 is −M3 (higher probability of correctness) since the read state would have to be off by three states from the programmed state, e.g., state 8 (where the lower bit is 0, not 1). However, the LLR for the lower bit for state 6 is −M2 (intermediate probability of correctness) since the read state would have to be off by two states for the bit to be erroneous. Similarly, the LLR for the lower bit for state 7 is −M1 (lower probability of correctness) since the read state would have to be off by only one state for the bit to be erroneous. Similar reasoning applies to the other bit positions. For example, the LLRs for the top bits indicate a relatively low probability of correctness since an error of only one state would result in the bit being incorrect.

LLR values are measures of the reliability with which we know the values of various binary bits read from storage elements. The LLR for a bit is given by equation (1.2). An LLR>0 indicates a bit is more likely a 0 than a 1, while an LLR<0 indicates a bit is more likely a 1 than a 0, based on one or more parity checks of the error correction code. Further, a greater magnitude indicates a greater probability or reliability. Thus, a bit with an LLR=20 is more likely to be a 0 than a bit with an LLR=10, and a bit with an LLR=−20 is more likely to be a 1 than a bit with an LLR=−10. LLR=0 indicates the bit is equally likely to be a 0 or a 1.

Referring again to FIG. 8, the first decoder 808 receives the initial LLRs, which are a representation of the codeword expressed as the de-mapper output 'Y'. The first decoder 808 iterates in successive iterations in which it determines if parity checks of the error encoding process have been satisfied. If all parity checks are satisfied initially, the decoding process has converged and the code word is not erroneous. If one or more parity checks have not been satisfied, the decoder will adjust the LLRs of one or more of the bits which are inconsistent with a parity check and then reapply the parity check to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. Once the parity check in question has been satisfied, the next parity check, if applicable, is applied to the code word. The process continues in an attempt to satisfy all parity checks. Thus, if successful, the decoding process of y is completed to obtain the decoded information bits i.

However, the first decoder 808 may not be successful due to trapping sets or other reasons, as discussed previously. Accordingly, a determination can be made as to when the first decoder has failed to converge based on, e.g., whether or not the iterative decoding process approaches convergence within a given time period and/or a given number of iterations, and/or a specific number of parity checks have been satisfied. If the first decoder 808 fails, the initial LLRs are passed to the second decoder 810, which attempts to decode the data as discussed previously.

FIG. 11 is a flowchart of a process for performing a read operation on a storage element using first and second decoders. The read operation begins at step 1100. The read operation can include sensing whether the threshold voltage ($V_{TH}$) of a storage element is above or below a number of compare points (step 1102). Optionally, some of the comparison points can result in hard bits, e.g., for comparison points that separate $V_{TH}$ ranges of programming states, and some of the comparison points can result in soft bits, e.g., for comparison points that bisect a $V_{TH}$ range of a programming state. In one approach, the read operation can use a first set of compare points followed by a second set of compare points which bisect the first set.

In practice, a number of storage elements may be read during the read operation. For example, the error correction coding may be applied over a number of storage elements, in which case read results are obtained from those storage elements for use in the decoding. Based on the reading, the programming states of the storage elements are determined (step 1104) and corresponding code words Y are assigned (step 1106). For example, the code words or bit assignments of FIG. 9 may be used when there are sixteen states. Step 1108 includes assigning an initial probability metric, e.g., LLR, to each bit in the code words. For example, this step can involve reading the LLR table 806 of FIG. 10. Step 1110 includes performing iterative decoding using the first decoder, starting with the initial LLRs. At decision step 1112, if the decoding is successful (e.g., converges within a predefined number of iterations, or predefined time period, or satisfies a given number of parity checks), the decoded codewords are used as the final read result (step 1120) before the read operation ends (step 1122).

At decision step 1112, if the decoding is not successful, step 1114 includes performing iterative decoding using the second decoder, starting with initial LLRs. The initial LLRs of the second decoder can be provided, e.g., by clipping the ending LLRs which are provided by the first decoder when it fails to complete decoding, in one possible approach. At decision step 1116, if the decoding is successful, the decoded codewords are used as the final read result (step 1120) before the read operation ends (step 1122). If the decoding at the second decoder is not successful, an error may be declared (step 1118). Note that the decoding at the second decoder can differ from the decoding at the first decoder in various aspects other than resolution/number of LLR bits. For example, the decoding at the second decoder may perform more iterations than the first decoder before declaring an error. The decoding techniques discussed herein are generally applicable to decoders for memory devices, and are not necessarily limited to non-volatile memory devices such as NAND devices. Further, the use of decoding using LDPC with LLRs is just an example. The technology can be applied to any soft decoder which can detect decoding failures.

Further, various types of iterative probabilistic decoding can be used, including maximum a posteriori (MAP) decoding and soft output Viterbi decoding.

Accordingly, it can be seen that, in one embodiment of the technology, a method of decoding a representation of a codeword includes: (a) applying a decoder to the representation of the codeword, (b) if the applying of the decoder fails to decode the representation of the codeword: changing at least one parameter of the decoder, wherein the parameter is associated with a probability value, thereby obtaining a modified decoder, and (c) applying the modified decoder to the representation of the codeword.

In another embodiment, a computer-implemented method of decoding a representation of a codeword includes: (a) applying a decoder to the representation of the codeword, (b) if the applying of the decoder terminates decoding the representation of the codeword before convergence is reached: changing at least one parameter of the decoder, wherein the parameter is associated with a reliability measure of at least one bit of the representation of the codeword, thereby obtaining a modified decoder, and (c) applying the modified decoder to the representation of the codeword.

In another embodiment, a decoding apparatus includes a memory array, and one or more controllers. The one or more controllers read a representation of a codeword from the memory array and applying a decoder to the representation of the codeword, and if the decoder fails to decode the representation of the codeword, changes at least one parameter of the decoder, wherein the at least one parameter is associated with a probability value, thereby obtaining a modified decoder, and applies the modified decoder to the representation of the codeword.

In another embodiment, a computer-implemented of decoding a representation of a codeword includes attempting to decode a representation of the codeword using iterative probabilistic decoding at a first resolution, where the iterative probabilistic decoding uses reliability metrics comprising logarithmic likelihood ratios, and if the attempting fails, attempting to decode the representation of the codeword using iterative probabilistic decoding at a second, lower resolution.

In another embodiment, a decoding apparatus includes a memory array, and one or more controllers, including a first decoder, an associated first processing unit, a second decoder, and an associated second processing unit. The one or more controllers read a representation of a codeword from the memory array and cause the first processing unit to provide first initial logarithmic likelihood ratio values to the first decoder, in response to which the first decoder attempts to decode the representation of the codeword using iterative probabilistic decoding, starting with the first initial logarithmic likelihood ratio values and ending with final logarithmic likelihood ratio values which result from operation of the first decoder. If the attempt fails, the one or more controllers cause the first decoder to provide the representation of the codeword and the final logarithmic likelihood ratio values to the second processing unit, where the second processing unit reduces magnitudes of at least some of the final logarithmic likelihood ratio values to provide modified logarithmic likelihood ratio values, and provides the modified logarithmic likelihood ratio values to the second decoder. The second decoder attempts to decode the representation of the codeword using the modified logarithmic likelihood ratio values as second initial logarithmic likelihood ratios.

Corresponding methods, systems and computer- or processor-readable storage devices which are encoded with instructions which, when executed, perform the methods provided herein, may be provided.

The foregoing detailed description of the technology has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application, to thereby enable others skilled in the art to best utilize the technology in various embodiments and with various modifications as are suited to the particular use contemplated. It is intended that the scope of the technology be defined by the claims appended hereto.

What is claimed is:

1. A computer-implemented method of decoding a representation of a codeword, comprising the steps of:
   (a) applying a decoder to the representation of the codeword, the representation of the codeword comprises a set of bits, and the decoder associates a bit estimation with each bit indicating a probable value of the bit, each bit estimation has a respective absolute value;
   (b) if the applying of the decoder fails to decode the representation of the codeword, reducing the respective absolute value of each bit estimation to a certain value, thereby obtaining a modified decoder; and
   (c) applying the modified decoder to the representation of the codeword.

2. The computer-implemented method of claim 1, wherein the decoder comprises a soft decoder using a message passing algorithm.

3. The computer-implemented method of claim 1, wherein the set of bits comprises information bits and a parity bit.

4. The computer-implemented method of claim 3, wherein each bit estimation comprises a logarithmic likelihood ratio value.

5. The computer-implemented method of claim 3, wherein the respective absolute value of each bit estimation is greater when a reliability of the associated bit is greater.

6. The computer-implemented method of claim 5, wherein a polarity of each bit estimation indicates whether the associated bit is more likely a 0 or a 1.

7. The computer-implemented method of claim 1, wherein:
   the decoding is performed in a multi-level non-volatile memory device and the codeword represents one of a plurality of data states in the multi-level non-volatile memory device.

8. A non-transitory processor-readable storage medium having processor-readable code embodied thereon, where the processor-readable code, when executed, performs the computer-implemented method of claim 1.

9. A decoder for a memory device which performs the computer-implemented method of claim 1.

10. A computer-implemented method of decoding a representation of a codeword, comprising the steps of:
    (a) applying a decoder to the representation of the codeword;
    (b) if the applying of the decoder terminates decoding of the representation of the codeword before convergence is reached: changing a parameter of the decoder, wherein the parameter is associated with a reliability measure of at least one bit of the representation of the codeword, thereby obtaining a modified decoder; and
    (c) applying the modified decoder to the representation of the codeword.

11. The computer-implemented method of claim 10, wherein the decoder comprises a soft decoder using a message passing algorithm.

12. The computer-implemented method of claim 10, wherein the parameter is used in determining a reliability measure for at least one step of the decoding algorithm.

13. The computer-implemented method of claim 12, wherein the reliability measure is a logarithmic likelihood ratio value.

14. The computer-implemented method of claim 13, wherein the parameter includes a parameter for clipping the logarithmic likelihood ratio value.

15. The computer-implemented method of claim 14, wherein the clipping is performed on an absolute value of the logarithmic likelihood ratio value.

16. The computer-implemented method of claim 10, wherein:
    the decoding is performed in a multi-level non-volatile memory device and the codeword represents one of a plurality of data states in the multi-level non-volatile memory device.

17. A decoder for a memory device which performs the computer-implemented method of claim 10.

18. A non-transitory processor-readable storage medium having processor-readable code embodied thereon, where the processor-readable code, when executed, performs the computer-implemented method of claim 10.

19. A decoding apparatus, comprising:
    a memory array; and
    one or more controllers, the one or more controllers read a representation of a codeword from the memory array and apply a decoder to the representation of the codeword, the representation of the codeword comprises a set of bits, and the decoder associates a bit estimation with each bit indicating a probable value of the bit, each bit estimation has a respective absolute value, and if the decoder fails to decode the representation of the codeword, clips the respective absolute value of each bit estimation to a certain value thereby obtaining a modified decoder, and applies the modified decoder to the representation of the codeword.

20. The decoding apparatus of claim 19, wherein the decoder comprises a soft decoder using a message passing algorithm.

21. The decoding apparatus of claim 19, wherein the set of bits comprises information bits and a parity bit.

22. The decoding apparatus of claim 21, wherein each bit estimation comprises a logarithmic likelihood ratio value.

23. The decoding apparatus of claim 21, wherein the respective absolute value of each bit estimation is greater when a reliability of the associated bit is greater.

24. The decoding apparatus of claim 23, wherein a polarity of each bit estimation indicates whether the associated bit is more likely a 0 or a 1.

25. A computer-implemented method of decoding a representation of a codeword, comprising:
    attempting to decode a representation of the codeword using iterative probabilistic decoding at a first resolution, the iterative probabilistic decoding uses reliability metrics comprising logarithmic likelihood ratios, and the first resolution comprises a first bit resolution by which the logarithmic likelihood ratios are computed; and
    if the attempting fails, attempting to decode the representation of the codeword using iterative probabilistic decoding at a second, lower resolution the second, lower resolution comprises a second bit resolution, lower than the first bit resolution, by which the logarithmic likelihood ratios are computed.

26. A memory apparatus, comprising:
a memory array; and
one or more controllers, including a first decoder, an associated first processing unit, a second decoder, and an associated second processing unit, the one or more controllers read a representation of a codeword from the memory array and cause the first processing unit to provide first initial logarithmic likelihood ratio values to the first decoder, in response to which the first decoder attempts to decode the representation of the codeword using iterative probabilistic decoding, starting with the first initial logarithmic likelihood ratio values and ending with final logarithmic likelihood ratio values which result from operation of the first decoder, and if the attempt fails, cause the first decoder to provide the representation of the codeword and the final logarithmic likelihood ratio values to the second processing unit, where the second processing unit reduces magnitudes of at least some of the final logarithmic likelihood ratio values to provide modified logarithmic likelihood ratio values, and provides the modified logarithmic likelihood ratio values to the second decoder, where the second decoder attempts to decode the representation of the codeword using the modified logarithmic likelihood ratio values as second initial logarithmic likelihood ratios.

27. The memory apparatus of claim 26, wherein:
the second processing unit reduces magnitudes of at least some of the final logarithmic likelihood ratio values by clipping the magnitudes so that the magnitudes do not exceed a certain value, but does not change sign bits of the final logarithmic likelihood ratio values, to provide the modified logarithmic likelihood ratio values.

* * * * *